United States Patent
Wu et al.

(10) Patent No.: US 11,791,158 B2
(45) Date of Patent: Oct. 17, 2023

(54) SELECTIVE SIGESN:B DEPOSITION

(71) Applicant: Applied Materials, Inc., Santa Clara, CA (US)

(72) Inventors: Chen-Ying Wu, Sunnyvale, CA (US); Yi-Chiau Huang, Fremont, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 17/577,113

(22) Filed: Jan. 17, 2022

(65) Prior Publication Data
US 2022/0230877 A1    Jul. 21, 2022

Related U.S. Application Data

(60) Provisional application No. 63/138,589, filed on Jan. 18, 2021.

(51) Int. Cl.
*H01L 21/02* (2006.01)

(52) U.S. Cl.
CPC .. *H01L 21/02535* (2013.01); *H01L 21/02532* (2013.01); *H01L 21/02579* (2013.01)

(58) Field of Classification Search
CPC ......... H01L 21/02535; H01L 21/02532; H01L 21/02579
USPC ....................................................... 438/478
See application file for complete search history.

(56) References Cited

U.S. PATENT DOCUMENTS

| 4,239,584 A | 12/1980 | Chang et al. |
| 2013/0183814 A1* | 7/2013 | Huang ............... H01L 21/0262 438/478 |
| 2013/0330911 A1 | 12/2013 | Huang et al. |
| 2014/0024204 A1 | 1/2014 | Hikavyy et al. |
| 2015/0048485 A1 | 2/2015 | Tolle |
| 2017/0084456 A1* | 3/2017 | Olsen ................ H01L 21/02046 |
| 2018/0323059 A1* | 11/2018 | Bhargava ................ C30B 29/06 |
| 2019/0067004 A1* | 2/2019 | Kohen .................. H01L 23/535 |

OTHER PUBLICATIONS

PCT International Search Report and Written Opinion in PCT/US2022/012672 dated May 4, 2022, 9 pages.
Hamilton, Merle D., "Electrical and Optical Characterization of Si—Ge—Sn", (2012). Theses and Dissertations. 1176. https://scholar.afit.edu/etd/1176.
Mosleh, Aboozar, "Epitaxial Growth of Si-Ge-Sn Alloys for Optoelectronic Device Application", Theses and Dissertations. 1749. http://scholarworks.uark.edu/etd/1749.
Wang, G. H., et al., "Realization of Silicon-Germanium-Tin (SiGeSn) Source/Drain Stressors by Sn implant and Solid Phase Epitaxy for strain engineering in SiGe channel P-MOSFETs", 2008 International Symposium on VLSI Technology, Systems and Applications (VLSI-TSA), 2008, pp. 128-129, doi: 10.1109/VTSA.2008.4530830.
Wirths, S. , "Growth Studies Of Doped SiGeSn/Strained Ge(Sn) Heterostructures", ECS Transactions, 64 (6) 689-696 (2014).

* cited by examiner

*Primary Examiner* — Tucker J Wright
(74) *Attorney, Agent, or Firm* — Servilla Whitney LLC

(57) ABSTRACT

Methods for depositing a silicon germanium tin boron (SiGeSn:B) film on a substrate are described. The method comprises exposing a substrate to a precursor mixture comprising a boron precursor, a silicon precursor, a germanium precursor, and a tin precursor to form a boron silicon germanium tin (SiGeSn:B) film on the substrate.

20 Claims, 2 Drawing Sheets

SELECTIVE SIGESN:B DEPOSITION

CROSS-REFERENCE TO RELATED APPLICATIONS

This application claims priority to U.S. Provisional Application No. 63/138,589, filed Jan. 18, 2021, the entire disclosure of which is hereby incorporated by reference herein.

TECHNICAL FIELD

Embodiments of the present disclosure pertain to the field of electronic device manufacturing, and in particular, to an integrated circuit (IC) manufacturing. More particularly, embodiments of the disclosure provide methods of depositing silicon germanium tin boron (SiGeSn:B) films by remote plasma chemical vapor deposition RPCVD).

BACKGROUND

Integrated circuits have evolved into complex devices that can include millions of transistors, capacitors, and resistors on a single chip. The evolution of chip designs continually requires faster circuitry and greater circuit density. The demands for faster circuits with greater circuit densities impose corresponding demands on the materials used to fabricate such integrated circuits. In particular, as the dimensions of integrated circuit components are reduced, it is necessary to use low resistivity conductive materials as well as low dielectric constant insulating materials to obtain suitable electrical performance from such components.

As device dimensions have shrunk, device geometries and materials have experienced difficulty maintaining switching speeds without incurring failures. Several new technologies have emerged that allow chip designers to continue shrinking device dimensions. Control of the dimensions of device structure is a key challenge for present and future technology generations.

Microelectronic devices are fabricated on a semiconductor substrate as integrated circuits in which various conductive layers are interconnected with one another to permit electronic signals to propagate within the device. An example of such a device is a complementary metal-oxide-semiconductor (CMOS) field effect transistor (FET) or MOSFET. A gate electrode is part of an integrated circuit. For example, a MOSFET comprises a gate structure disposed between source and drain regions that are formed in the semiconductor substrate. The gate structure or stack generally comprises a gate electrode and a gate dielectric. The gate electrode is disposed over the gate dielectric to control a flow of charge carriers in a channel region that is formed between drain and source regions beneath the gate dielectric.

The addition of tin (Sn) is known to lower contact resistivity in pMOS contacts. Selective low-temperature Sn containing processes are very challenging due to incompatibility between precursors at low temperature. Examples of incompatibility include boron (B) and chlorine (Cl), tin (Sn) and boron (B), and germanium (Ge) and boron (B). Accordingly, there is a need for new materials and methods of manufacture for interface engineering between semiconductor and metal layers.

SUMMARY

Methods to form films are described. In one or more embodiments, a method of forming a film comprises exposing a substrate to a precursor mixture comprising a boron precursor, a silicon precursor, a germanium precursor, and a tin precursor to form a boron silicon germanium tin (SiGeSn:B) film on the substrate.

One or more embodiments provide a method of forming a film. The method comprises coflowing a precursor mixture in a carrier gas over a substrate surface at a temperature in a range of from 250° C. to 400° C. at a pressure in a range of from 40 Torr to 600 Torr, the precursor mixture comprising a boron (B) precursor, a silicon (Si) precursor, a germanium (Ge) precursor, and a tin (Sn) precursor to form a boron silicon germanium tin (SiGeSn:B) film on the substrate surface.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments. The embodiments as described herein are illustrated by way of example and not limitation in the figures of the accompanying drawings in which like references indicate similar elements.

DETAILED DESCRIPTION

Figure 1A:
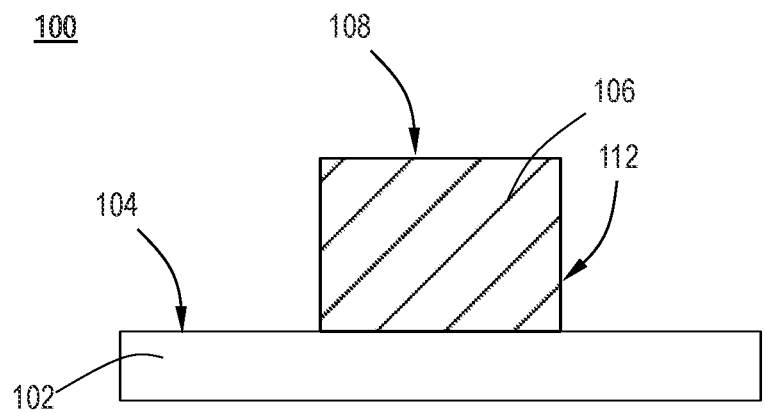
FIG. 1A illustrates a cross-section view of a device according to one or more embodiments.

Before describing several exemplary embodiments of the disclosure, it is to be understood that the disclosure is not limited to the details of construction or process steps set forth in the following description. The disclosure is capable of other embodiments and of being practiced or being carried out in various ways.

As used in this specification and the appended claims, the term "substrate" refers to a surface, or portion of a surface, upon which a process acts. It will also be understood by those skilled in the art that reference to a substrate can also refer to only a portion of the substrate, unless the context clearly indicates otherwise. Additionally, reference to depositing on a substrate can mean both a bare substrate and a substrate with one or more films or features deposited or formed thereon.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, silicon nitride, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate (or otherwise generate or graft target chemical moieties to impart chemical functionality), anneal and/or bake the substrate surface. In addition to film processing directly on the surface of the substrate itself, in the present disclosure, any of the film processing steps disclosed may also be performed on an underlayer formed on the substrate as disclosed in more detail below, and the term "substrate surface" is intended to include such underlayer as the context indicates. Thus for example, where a film/layer or partial film/layer has been deposited onto a substrate surface, the exposed surface of the newly deposited film/layer becomes the substrate surface. What a given substrate surface comprises will depend on what films are to be deposited, as well as the particular chemistry used.

As used in this specification and the appended claims, the terms "precursor", "reactant", "reactive gas" and the like are used interchangeably to refer to any gaseous species that can react with the substrate surface. In one or more embodiments, the precursor is a silicon based precursor.

Transistors are circuit components or elements that are often formed on semiconductor devices. Depending upon the circuit design, in addition to capacitors, inductors, resistors, diodes, conductive lines, or other elements, transistors are formed on a semiconductor device. Generally, a transistor includes a gate formed between source and drain regions. In one or more embodiments, the source and drain regions include a doped region of a substrate and exhibit a doping profile suitable for a particular application. The gate is positioned over the channel region and includes a gate dielectric interposed between a gate electrode and the channel region in the substrate.

As used herein, the term "field effect transistor" or "FET" refers to a transistor that uses an electric field to control the electrical behavior of the device. Enhancement mode field effect transistors generally display very high input impedance at low temperatures. The conductivity between the drain and source terminals is controlled by an electric field in the device, which is generated by a voltage difference between the body and the gate of the device. The FET's three terminals are source (S), through which the carriers enter the channel; drain (D), through which the carriers leave the channel; and gate (G), the terminal that modulates the channel conductivity. Conventionally, current entering the channel at the source (S) is designated $I_S$ and current entering the channel at the drain (D) is designated $I_D$. Drain-to-source voltage is designated $V_{DS}$. By applying voltage to gate (G), the current entering the channel at the drain (i.e. $I_D$) can be controlled.

The metal-oxide-semiconductor field-effect transistor (MOSFET) is a type of field-effect transistor (FET). It has an insulated gate, whose voltage determines the conductivity of the device. This ability to change conductivity with the amount of applied voltage is used for amplifying or switching electronic signals. A MOSFET is based on the modulation of charge concentration by a metal-oxide-semiconductor (MOS) capacitance between a body electrode and a gate electrode located above the body and insulated from all other device regions by a gate dielectric layer. Compared to the MOS capacitor, the MOSFET includes two additional terminals (source and drain), each connected to individual highly doped regions that are separated by the body region. These regions can be either p or n type, but they are both be of the same type, and of opposite type to the body region. The source and drain (unlike the body) are highly doped as signified by a "+" sign after the type of doping.

If the MOSFET is an n-channel or nMOS FET, then the source and drain are n+ regions and the body is a p region. If the MOSFET is a p-channel or pMOS FET, then the source and drain are p+ regions and the body is an n region. The source is so named because it is the source of the charge carriers (electrons for n-channel, holes for p-channel) that flow through the channel; similarly, the drain is where the charge carriers leave the channel.

As used herein, the term "fin field-effect transistor (Fin-FET)" refers to a MOSFET transistor built on a substrate where the gate is placed on two or three sides of the channel, forming a double- or triple-gate structure. FinFET devices have been given the generic name FinFETs because the channel region forms a "fin" on the substrate. FinFET devices have fast switching times and high current density.

The embodiments of the disclosure are described by way of the Figures, which illustrate devices and processes for forming the devices in accordance with one or more embodiments of the disclosure. The processes shown are merely illustrative possible uses for the disclosed processes, and the skilled artisan will recognize that the disclosed processes are not limited to the illustrated applications.

One or more embodiments advantageously provide the formation of silicon germanium tin boron (SiGeSn:B) films through the use of a remote plasma chemical vapor deposition (RPCVD) process. In one or more embodiments, a unique combination of chemical precursors is used to combine Si, Ge, Sn, and B in the same matrix by a low-temperature selective process. The epilayer thereby formed not only contains tin (Sn), but also has a high (activated) boron (B) concentration. Formation of contacts by epitaxy is an application using epitaxial processes. One or more embodiments, provide a solution to forming low-temperature, highly selective, highly doped epilayers with low Schottky barrier height.

FIG. 1A illustrates a cross-sectional view of a device 100 according to one or more embodiments. In one or more embodiments, a feature 106 is formed on a top surface 104 of substrate 102. The substrate 102 is provided for processing. As used in this specification and the appended claims, the term "provided" means that the substrate is made available for processing (e.g., positioned in a processing chamber).

The Figures show substrates having a single feature for illustrative purposes; however, those skilled in the art will understand that there can be more than one feature. The shape of the feature 106 can be any suitable shape including, but not limited to, peaks, trenches, and vias. As used in this regard, the term "feature" means any intentional surface irregularity. Suitable examples of features include, but are not limited to trenches and vias, which have a top surface, at least one sidewall and a bottom surface, peaks which have a top surface 108 and at least one sidewall 112. Features can have any suitable aspect ratio (ratio of the depth of the feature to the width of the feature). In some embodiments, the aspect ratio is greater than or equal to about 5:1, 10:1, 15:1, 20:1, 25:1, 30:1, 35:1 or 40:1.

Figure 1B:
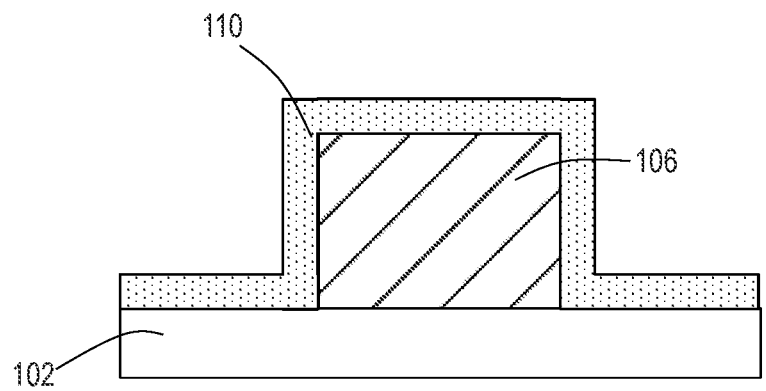
FIG. 1B illustrates a cross-section view of a device according to one or more embodiments.

Referring to FIG. 1B, a silicon germanium tin boron (SiGeSn:B) film 110 is deposited conformally on the top surface 104 of the substrate 102 and on the top surface 108 and on at least one sidewall 112 of the feature 106. In one or more embodiments, the silicon germanium tin boron (SiGeSn:B) film 110 is deposited by remote plasma chemical vapor deposition. As used herein, "chemical vapor deposition" refers to a process in which a substrate surface is exposed to precursors and/or co-reagents simultaneous or substantially simultaneously. As used herein, "substantially simultaneously" refers to either co-flow or where there is overlap for a majority of exposures of the precursors.

In the process of one or more embodiments, reactant gases, e.g. a silicon precursor, a germanium precursor, a tin precursor, and a boron precursor are introduced into a reaction chamber. In some embodiments, the reactant gas comprises a precursor mixture of a silicon precursor, a germanium precursor, a tin precursor, and a boron precursor. The reactant gases are then decomposed to create excited radicals from the precursors. The excited radicals are chemically bound to the surfaces of the substrate and react, forming the silicon germanium tin boron (SiGeSn:B) film 110. The gaseous by-products of the reaction are then desorbed and removed from the reaction chamber.

In one or more embodiments, the silicon (Si) precursor comprises any suitable silicon precursor known to the skilled artisan. In one or more embodiments, the silicon precursor comprises one or more of silane ($SiH_4$), disilane ($Si_2H_6$), and a silicon halide. In one or more embodiments, the silicon halide is selected from the group consisting of silicon chloride ($SiCl_4$), silicon fluoride ($SiF_4$), silicon bromide ($SiBr_4$), and silicon iodide ($SiI_4$).

In one or more embodiments, the silicon precursor is present in an amount in a range of from greater than 0 sccm to 1000 sccm, including from 5 sccm to 1000 sccm, 5 sccm to 900 sccm, 5 sccm to 800 sccm, 5 sccm to 700 sccm, 5 sccm to 600 sccm, 5 sccm to 500 sccm, 5 sccm to 400 sccm, 5 sccm to 300 sccm, 5 sccm to 200 sccm, 5 sccm to 100 sccm, 10 sccm to 1000 sccm, 10 sccm to 900 sccm, 10 sccm to 800 sccm, 10 sccm to 700 sccm, 10 sccm to 600 sccm, 10 sccm to 500 sccm, 10 sccm to 400 sccm, 10 sccm to 300 sccm, 10 sccm to 200 sccm, 10 sccm to 100 sccm, 20 sccm to 1000 sccm, 20 sccm to 900 sccm, 20 sccm to 800 sccm, 20 sccm to 700 sccm, 20 sccm to 600 sccm, 20 sccm to 500 sccm, 20 sccm to 400 sccm, 20 sccm to 300 sccm, 20 sccm to 200 sccm, 20 sccm to 200 sccm, 30 sccm to 1000 sccm, 30 sccm to 900 sccm, 30 sccm to 800 sccm, 30 sccm to 700 sccm, 30 sccm to 600 sccm, 30 sccm to 500 sccm, 30 sccm to 400 sccm, 30 sccm to 300 sccm, 30 sccm to 200 sccm, 30 sccm to 100 sccm, 40 sccm to 1000 sccm, 40 sccm to 900 sccm, 40 sccm to 800 sccm, 40 sccm to 700 sccm, 40 sccm to 600 sccm, 40 sccm to 500 sccm, 40 sccm to 400 sccm, 40 sccm to 300 sccm, 40 sccm to 200 sccm, 40 sccm to 400 sccm, 50 sccm to 1000 sccm, 50 sccm to 900 sccm, 50 sccm to 800 sccm, 50 sccm to 700 sccm, 50 sccm to 600 sccm, 50 sccm to 500 sccm, 50 sccm to 400 sccm, 50 sccm to 300 sccm, 50 sccm to 200 sccm, 50 sccm to 100 sccm, 60 sccm to 1000 sccm, 60 sccm to 900 sccm, 60 sccm to 800 sccm, 60 sccm to 700 sccm, 60 sccm to 600 sccm, 60 sccm to 500 sccm, 60 sccm to 400 sccm, 60 sccm to 300 sccm, 60 sccm to 200 sccm, 70 sccm to 1000 sccm, 70 sccm to 750 sccm, 70 to 500 sccm, 70 to 250 sccm, 80 sccm to 1000 sccm, 80 sccm to 750 sccm, 80 sccm to 500 sccm, 80 to 250 sccm, 90 sccm to 1000 sccm, 90 sccm to 750 sccm, 90 sccm to 500 sccm, 90 to 250 sccm, 100 sccm to 1000 sccm, 100 sccm to 750 sccm, 100 to 500 sccm, 100 to 250 sccm, 200 sccm to 1000 sccm, 300 sccm to 1000 sccm, 400 sccm to 1000 sccm, and 500 sccm to 1000 sccm. In some embodiments, the silicon precursor is present in an amount greater than 0 sccm.

In one or more embodiments, the germanium (Ge) precursor comprises any suitable germanium precursor known to the skilled artisan. In one or more embodiments, the germanium precursor comprises one or more of germane ($GeH_4$) and digermane ($Ge_2H_6$).

In one or more embodiments, the germanium (Ge) precursor is present in an amount in a range of from greater than 0 sccm to 100 sccm, including a range of from 1 sccm to 100 sccm, a range of from 5 sccm to 100 sccm, and a range of from 0.5 sccm to 100 sccm. In some embodiments, the germanium precursor is present in an amount greater than 0 sccm. In some embodiments, the germanium precursor is present in an amount less than 100 sccm.

In one or more embodiments, the tin (Sn) precursor comprises any suitable tin precursor known to the skill artisan. In some embodiments, the tin (Sn) precursor comprises tin chloride ($SnCl_4$). In one or more embodiments, the tin precursor is present as a liquid.

In one or more embodiments, the tin (Sn) precursor is present in an amount in a range of from greater than 0 sccm to 10 sccm, including a range of from 1 sccm to 10 sccm, a range of from 0.1 sccm to 10 sccm, and a range of from 0.5 sccm to 10 sccm. In some embodiments, the tin (Sn) precursor is present in an amount greater than 0 sccm. In some embodiments, the tin (Sn) precursor is present in an amount less than 10 sccm.

In one or more embodiments, the boron (B) precursor comprises any suitable boron precursor known to the skilled artisan. In some embodiments, the boron precursor comprises diborane ($B_2H_6$).

In one or more embodiments, the boron (B) precursor is present in an amount in a range of from greater than 0 sccm to 1 sccm, including 0.1 sccm, 0.2 sccm, 0.3 sccm, 0.4 sccm, 0.5 sccm, 0.6 sccm, 0.7 sccm, 0.8 sccm, 0.9 sccm, and 1.0 sccm. In some embodiments, the boron precursor is present in an amount greater than 0 sccm. In some embodiments, the boron precursor is present in an amount less than 1 sccm.

In specific embodiments, the boron precursor is present in an amount in a range of from greater than 0 sccm to 1 sccm, the silicon precursor is present in an amount in a range of from greater than 0 sccm to 1000 sccm, the germanium precursor is present in an amount in a range of from greater than 0 sccm to 100 sccm, and the tin precursor is present in an amount in a range of from greater than 0 sccm to 10 sccm.

In one or more embodiments, the precursor mixture may further comprise germanium chloride ($GeCl_4$). In some embodiments, the germanium chloride precursor is a liquid. In other embodiments, the precursor mixture does not comprise germanium chloride ($GeCl_4$).

In one or more embodiments, the surfaces 104, 108 are exposed to a precursor mixture comprising a boron precursor, a silicon precursor, a germanium precursor, and a tin precursor at a temperature less than 450° C. and at a pressure of in a range of from 40 Torr to 600 Torr to form the silicon germanium tin boron (SiGeSn:B) film 110 on the surfaces 104, 108.

In one or more embodiments, the temperature is less than 450° C. In other embodiments, the temperature is in a range of from 250° C. to 400° C. In specific embodiments, a boron (B) doped silicon germanium tin (SiGeSn) epilayer is formed selectively at a temperature in a range of from 280° C. to 350° C. through a precursor mixture comprising a boron precursor, a silicon precursor, a germanium precursor, and a tin precursor.

The remote plasma CVD process of one or more embodiments may be performed at a pressure in a range of from 40 Torr to 600 Torr, including a range of from 45 Torr to about 550 Torr, or a range of from 50 Torr to 500 Torr. In one or more embodiments, the pressure is less than or equal to about 600 Torr.

In one or more embodiments, the precursor mixture comprising a boron precursor, a silicon precursor, a germanium precursor, and a tin precursor are coflowed with a carrier gas into the reaction chamber. The carrier gas may be any suitable carrier gas known to the skilled artisan. In one or more embodiments, the carrier gas comprises one or more of argon (Ar), helium (He), nitrogen ($N_2$), and hydrogen ($H_2$). In specific embodiments, the carrier gas comprises hydrogen ($H_2$). In one or more embodiments, the carrier gas is present in an amount in a range of from 10 slm to 30 slm.

In one or more embodiments, the silicon germanium tin boron (SiGeSn:B) film 110 is a conformal film. As used in this specification and the appended claims, the term "conformal" means that the layer adapts to the contours of a feature or a layer. Conformality of a layer is typically quantified by a ratio of the average thickness of a layer deposited on the sidewalls of a feature to the average thickness of the same deposited layer on the field, or upper surface, of the substrate. Layers deposited by the methods described herein are observed to have a conformality of greater than about 30%, such as 70% or greater, about 7:10 or greater, such as about 80% or greater, about 4:5 or greater, to about 100%, about 1:1, or to about 200% or greater, about 2:1.

In some embodiments, the silicon germanium tin boron (SiGeSn:B) film 110 is a continuous film. As used herein, the term "continuous" refers to a layer that covers an entire exposed surface without gaps or bare spots that reveal material underlying the deposited layer. A continuous layer may have gaps or bare spots with a surface area less than about 1% of the total surface area of the film. In some embodiments, the silicon germanium tin boron (SiGeSn:B) film 110 is a pinhole-free film. As used herein, the term "pinhole-free" refers to a layer that covers an entire exposed surface without gaps, bare spots, holes, pinholes, and the like that reveal material underlying the deposited layer. A pinhole-free layer may have holes or pinholes with a surface area less than about 1% of the total surface area of the film.

In one or more embodiments, the silicon germanium tin boron (SiGeSn:B) film 110 has a thickness in the range of from about 5 nm to about 5000 nm. In other embodiments, the silicon germanium tin boron (SiGeSn:B) film 110 has a thickness in the range of from about 5 nm to about 100 nm. In some embodiments, the silicon germanium tin boron (SiGeSn:B) film 110 has a thickness in a range of from about 1000 nm to about 5000 nm.

Figure 2:
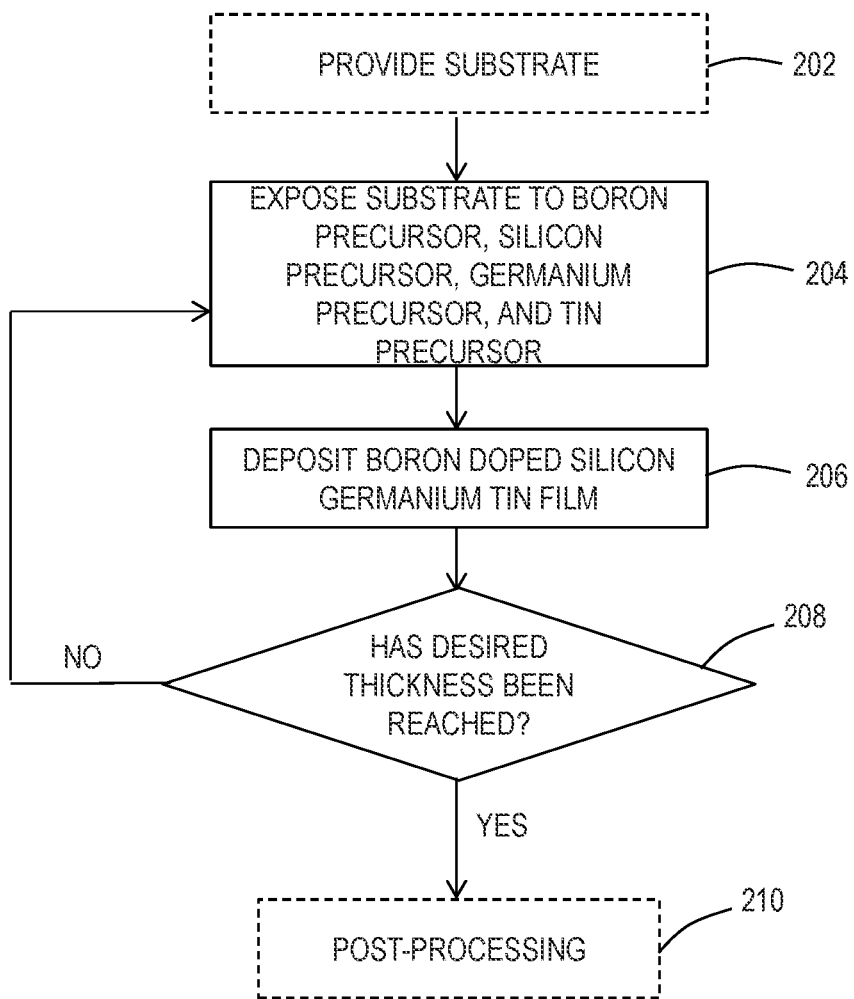
FIG. 2 illustrates a process flow diagram of a method according to one or more embodiments.

FIG. 2 illustrates a process flow diagram of a method 200 according to one or more embodiments. In one or more embodiments, at operation 202, a substrate is provided into a reaction chamber. It is noted that, in some embodiments, the substrate may already be present in a reaction chamber. In one or more embodiments, at operation 204, the substrate is exposed to a precursor mixture comprising a boron precursor, a silicon precursor, a germanium precursor, and a tin precursor. In some embodiments, the substrate is exposed to the boron precursor, silicon precursor, germanium precursor, and tin precursor simultaneously or substantially simultaneously. At operation 206, a silicon germanium tin boron (SiGeSn:B) film is deposited on the substrate surface. At decision point 208, the thickness of the deposited film, or number of cycles of the process is considered. If the deposited film has reached a predetermined thickness or a predetermined number of process cycles have been performed, the method 200 moves to an optional post-processing operation 210. If the thickness of the deposited film or the number of process cycles has not reached the predetermined threshold, the method 200 returns to operation 204 to expose the substrate to the precursor mixture comprising the boron precursor, the silicon precursor, the germanium precursor, and the tin precursor again.

The optional post-processing operation 210 can be, for example, a process to modify film properties or a further film deposition process (e.g., additional ALD or CVD processes) to grow additional films. In some embodiments, the post-processing operation 210 can be a process that modifies a property of the deposited film.

Embodiments described herein in reference to a remote plasma CVD process can be carried out using any suitable thin film deposition system. Examples of suitable systems include the PRECISION 5000® systems, PRODUCER® systems, PRODUCER® GT™ systems, PRODUCER® XP Precision™ systems, PRODUCER® SE™ systems, all of which are commercially available from Applied Materials, Inc., of Santa Clara, Calif. Other tools capable of performing remote plasma CVD processes may also be adapted to benefit from the embodiments described herein. In addition, any system enabling the remote plasma CVD processes described herein can be used to advantage. Any apparatus description described herein is illustrative and should not be construed or interpreted as limiting the scope of the implementations described herein.

In one or more embodiments, the remote plasma CVD processing chamber may be controlled using a controller. The controller can be any suitable component that can control the processing chamber(s). For example, the controller can be a computer including a central processing unit (CPU), memory, inputs/outputs, suitable circuits, and storage.

Processes may generally be stored in the memory of the controller as a software routine that, when executed by the processor, causes the process chamber to perform processes of the present disclosure. The software routine may also be stored and/or executed by a second processor that is remotely located from the hardware being controlled by the processor. Some or all of the method of the present disclosure may also be performed in hardware. As such, the process may be implemented in software and executed using a computer system, in hardware as, e.g., an application specific integrated circuit or other type of hardware implementation, or as a combination of software and hardware. The software routine, when executed by the processor, transforms the general purpose computer into a specific purpose computer (controller) that controls the chamber operation such that the processes are performed.

In some embodiments, the remote plasma CVD processing chamber is part of a tool for processing one or more substrates. In some embodiments, the remote plasma CVD processing chamber is in a modular system comprising multiple chambers which perform various functions including substrate center-finding and orientation, degassing, annealing, deposition and/or etching. According to one or more embodiments, the modular system includes at least a first processing chamber and a central transfer chamber. The central transfer chamber may house a robot that can shuttle substrates between and among processing chambers and load lock chambers. The transfer chamber is typically maintained at a vacuum condition and provides an intermediate stage for shuttling substrates from one chamber to another and/or to a load lock chamber positioned at a front end of the cluster tool. Two well-known modular systems which may be adapted for the present disclosure include Centura®, Dual ACP, Producer® GT, and Endura® platform, available from Applied Materials, Inc., of Santa Clara, Calif.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" may encompass both an orientation of above and below. The device may be otherwise oriented (rotated 90 degrees or at other orientations) and the spatially relative descriptors used herein interpreted accordingly.

The use of the terms "a" and "an" and "the" and similar referents in the context of describing the materials and methods discussed herein (especially in the context of the following claims) are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the materials and methods and does not pose a limitation on the scope unless otherwise claimed. No language in the specification should be construed as indicating any non-claimed element as essential to the practice of the disclosed materials and methods.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. In one or more embodiments, the particular features, structures, materials, or characteristics are combined in any suitable manner.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. A method of forming a film, the method comprising:
   exposing a substrate to a precursor mixture in a remote plasma chemical vapor deposition (RPCVD) process, the precursor mixture comprising a boron precursor, a silicon precursor, a germanium precursor, and a tin precursor to form a boron silicon germanium tin (Si-GeSn:B) film on the substrate.

2. The method of claim 1, wherein the boron precursor, the silicon precursor, the germanium precursor, and the tin precursor are coflowed at a temperature less than 450° C.

3. The method of claim 2, wherein the temperature is in a range of from 250° C. to 400° C.

4. The method of claim 2, wherein the pressure is in a range of from 40 Torr to 600 Torr.

5. The method of claim 1, wherein the boron precursor, the silicon precursor, the germanium precursor, and the tin precursor are coflowed, the boron precursor is present in an amount in a range of from greater than 0 sccm to 1 sccm, the silicon precursor is present in an amount in a range of from greater than 0 sccm to 1000 sccm, the germanium precursor is present in an amount in a range of from greater than 0 sccm to 100 sccm, and the tin precursor is present in an amount in a range of from greater than 0 sccm to 10 sccm.

6. The method of claim 1, wherein the silicon precursor comprises one or more of silane ($SiH_4$), disilane ($Si_2H_6$), and a silicon halide.

7. The method of claim 6, wherein the silicon halide is selected from the group consisting of silicon chloride ($SiCl_4$), silicon fluoride ($SiF_4$), silicon bromide ($SiBr_4$), and silicon iodide ($SiI_4$).

8. The method of claim 1, wherein the boron precursor comprises diborane ($B_2H_6$).

9. The method of claim 1, wherein the germanium precursor comprises one or more of germane ($GeH_4$) and digermane ($Ge_2H_6$).

10. The method of claim 1, wherein the tin precursor comprises tin chloride ($SnCl_4$).

11. The method of claim 10, wherein the tin precursor is a liquid.

12. The method of claim 1, wherein the precursor mixture further comprises germanium chloride ($GeCl_4$).

13. The method of claim 1, wherein the precursor mixture further comprises a carrier gas.

14. The method of claim 13, wherein the carrier gas comprises hydrogen.

15. The method of claim 14, wherein the carrier gas is present in an amount in a range of from 10 slm to 30 slm.

16. A method of forming a film, the method comprising:
    coflowing a precursor mixture in a carrier gas over a substrate surface at a temperature in a range of from 250° C. to 400° C. at a pressure in a range of from 40 Torr to 600 Torr in a remote plasma chemical vapor deposition (RPCVD) process, the precursor mixture comprising a boron (B) precursor, a silicon (Si) precursor, a germanium (Ge) precursor, and a tin (Sn) precursor to form a boron silicon germanium tin (Si-GeSn:B) film on the substrate surface.

17. The method of claim 16, wherein the carrier gas comprises hydrogen.

18. The method of claim 16, wherein the precursor mixture further comprises germanium chloride ($GeCl_4$).

19. The method of claim 18, wherein the silicon precursor comprises one or more of silane ($SiH_4$), disilane ($Si_2H_6$), silicon chloride ($SiCl_4$), silicon fluoride ($SiF_4$), silicon bromide ($SiBr_4$), and silicon iodide ($SiI_4$), the boron precursor comprises diborane ($B_2H_6$), the germanium precursor comprises one or more of germane ($GeH_4$) and digermane ($Ge_2H_6$), and the tin precursor comprises tin chloride ($SnCl_4$).

20. The method of claim 19, wherein the boron precursor is present in an amount in a range of from greater than 0 sccm to 1 sccm, the silicon precursor is present in an amount in a range of from greater than 0 sccm to 1000 sccm, the germanium precursor is present in an amount in a range of from greater than 0 sccm to 100 sccm, the tin precursor is present in an amount in a range of from greater than 0 sccm to 10 sccm, the germanium chloride is present in an amount in a range of from greater than 0 sccm to 100 sccm, and the carrier gas is present in an amount in a range of from 10 slm to 30 slm.

* * * * *